United States Patent
Earl et al.

(10) Patent No.: US 12,289,034 B2
(45) Date of Patent: Apr. 29, 2025

(54) PROCESS INTEGRATION IN ELECTRICAL POWER GENERATION

(71) Applicant: Sapphire Technologies, Inc., Cerritos, CA (US)

(72) Inventors: Jeffrey Earl, Cerritos, CA (US); Jeremy Liu, Cerritos, CA (US)

(73) Assignee: Sapphire Technologies, Inc., Cerritos, CA (US)

( * ) Notice: Subject to any disclaimer, the term of this patent is extended or adjusted under 35 U.S.C. 154(b) by 158 days.

(21) Appl. No.: 17/658,372

(22) Filed: Apr. 7, 2022

(65) Prior Publication Data

US 2023/0328934 A1    Oct. 12, 2023

(51) Int. Cl.
| H02K 7/18 | (2006.01) |
| H02K 9/14 | (2006.01) |
| H02K 9/18 | (2006.01) |
| H05K 7/20 | (2006.01) |

(52) U.S. Cl.
CPC ............. *H02K 7/1823* (2013.01); *H02K 9/18* (2013.01); *H05K 7/20763* (2013.01); *H02K 7/18* (2013.01); *H02K 7/1807* (2013.01); *H02K 9/14* (2013.01)

(58) Field of Classification Search
CPC ..... H02K 7/1823; H02K 9/18; H05K 7/20763
See application file for complete search history.

(56) References Cited

U.S. PATENT DOCUMENTS

| 3,508,090 A | 4/1970 | Crampton et al. |
| 5,689,175 A | 11/1997 | Hanson et al. |
| 7,638,892 B2 | 12/2009 | Myers |
| 8,146,360 B2 | 4/2012 | Myers et al. |
| 8,384,232 B2 | 2/2013 | Myers et al. |
| 8,400,005 B2 | 3/2013 | Huber et al. |
| 8,739,538 B2 * | 6/2014 | Myers ............... F01D 1/023 60/671 |

(Continued)

FOREIGN PATENT DOCUMENTS

| WO | WO 2013028088 | 2/2013 |
| WO | WO 2019050554 | 3/2019 |

OTHER PUBLICATIONS

International Search Report and Written Opinion in International Appln. No. PCT/US2023/017764, mailed on Jul. 26, 2023, 13 pages.

(Continued)

*Primary Examiner* — Tulsidas C Patel
*Assistant Examiner* — Mohammed Ahmed Qureshi
(74) *Attorney, Agent, or Firm* — Fish & Richardson P.C.

(57) ABSTRACT

A system includes an electric generator, a power electronics system, and a heat exchanger. The electric generator includes a turbine wheel, a rotor, and a stator. The turbine wheel is configured to receive process gas and rotate in response to expansion of the process gas flowing into an inlet of the turbine wheel and out of an outlet of the turbine wheel. The rotor is configured to rotate with the turbine wheel. The electric generator is configured to generate electrical power upon rotation of the rotor within the stator. The power electronics system is configured to convert the electrical power to specified power characteristics. The heat exchanger includes a first side in fluid communication with the process gas and a second side in fluid communication with a fluid stream from a second system. The heat exchanger is configured to cool the fluid stream using the process gas.

19 Claims, 4 Drawing Sheets

(56) References Cited

U.S. PATENT DOCUMENTS

| | | |
|---|---|---|
| 8,839,622 B2 | 9/2014 | Myers et al. |
| 10,557,414 B1 | 2/2020 | Stokes et al. |
| 11,225,905 B1 | 1/2022 | Holley et al. |
| 11,594,937 B1 | 2/2023 | Earl et al. |
| 11,686,223 B1 | 6/2023 | Liu et al. |
| 11,761,705 B2 | 9/2023 | Breon et al. |
| 2007/0163256 A1* | 7/2007 | McDonald ............... F17D 1/04 60/597 |
| 2008/0250789 A1 | 10/2008 | Myers et al. |
| 2009/0165461 A1 | 7/2009 | Klassen et al. |
| 2011/0283702 A1 | 11/2011 | Huber et al. |
| 2012/0013125 A1 | 1/2012 | Myers et al. |
| 2013/0286591 A1 | 10/2013 | Myers et al. |
| 2013/0300120 A1 | 11/2013 | Podrog |
| 2016/0338225 A1 | 11/2016 | Joshi et al. |
| 2019/0055899 A1 | 2/2019 | Munevar et al. |
| 2019/0153952 A1 | 5/2019 | Niergarth et al. |
| 2019/0366803 A1 | 12/2019 | Harris |
| 2021/0156308 A1 | 5/2021 | Jones |

OTHER PUBLICATIONS

International Search Report and Written Opinion in International Appln. No. PCT/US2023/017767, mailed on Jul. 26, 2023, 12 pages.

[No Author Listed], "Gas Letdown Generator™ for Data Centers," Langston Energy, presumed published on Aug. 19, 2021, retrieved on Jan. 30, 2025, 5 pages.

* cited by examiner

PROCESS INTEGRATION IN ELECTRICAL POWER GENERATION

TECHNICAL FIELD

This disclosure relates to electrical power generation.

BACKGROUND

Natural gas is one of the principal sources of energy for many of our day-to-day needs and activities. Natural gas is an attractive fossil fuel for its abundance. Hydrogen is a rapidly expanding global energy storage market. Hydrogen is used in many manufacturing processes, from petroleum refining to food processing. Hydrogen is also used as a fuel source for gas turbines and in a broad range of fuel cells to generate electricity in industrial and consumer transportation sectors.

The efficient and effective movement of such gases from producing regions to consumption regions requires an extensive and elaborate transportation system. Gas that is transported through pipelines travels at high pressure in the pipeline.

SUMMARY

This disclosure describes technologies relating to process integration in electrical power generation.

In a first aspect, a system includes an electric generator, a power electronics system, and a heat exchanger. The electric generator includes a turbine wheel, a rotor, and a stator. The turbine wheel is configured to receive process gas and rotate in response to expansion of the process gas flowing into an inlet of the turbine wheel and out of an outlet of the turbine wheel. The process gas cools as the process gas flows across the turbine wheel and expands. The process gas exiting the outlet of the turbine has a first temperature. The rotor is coupled to the turbine wheel. The rotor is configured to rotate with the turbine wheel. The stator surrounds the rotor. The electric generator is configured to generate electrical power upon rotation of the rotor within the stator. The power electronics system is electrically connected to an electrical output of the electric generator. The power electronics system is configured to receive the electrical power from the electric generator and convert the electrical power to specified power characteristics. The heat exchanger is located downstream of the turbine wheel. The heat exchanger includes a first side and a second side. The first side is in fluid communication with the process gas. The second side is in fluid communication with a fluid stream from a second system unrelated to the electric generator. The fluid stream entering the second side of the heat exchanger has a second temperature that is greater than the first temperature of the process gas exiting the outlet of the turbine wheel. The heat exchanger is configured to cool the fluid stream using the process gas to produce a cooled stream.

This, and other aspects, can include one or more of the following features. The electric generator can include a three-phase permanent magnet synchronous generator. The process gas can include at least one of nitrogen gas or natural gas. The second system can be unrelated to the process gas. The cooled stream can be a chilled water stream. The second system can be a district cooling system. The chilled water stream can be coupled to the district cooling system. The second system can include a data center rack. The fluid stream can be a heat transfer fluid that has received waste heat from the data center rack. The cooled stream can be coupled to the data center rack. The first temperature can be less than −100 degrees Celsius (° C.).

In a second aspect, a system includes an electric generator, a power electronics system, and a heat exchanger. The electric generator includes a turbine wheel, a rotor, and a stator. The turbine wheel is configured to receive a process gas and rotate in response to expansion of the process gas flowing into an inlet of the turbine wheel and out of an outlet of the turbine wheel. The process gas includes natural gas. The process gas cools as the process gas flows across the turbine wheel and expands. The process gas exiting the outlet of the turbine wheel has a first temperature. The rotor is coupled to the turbine wheel. The rotor is configured to rotate with the turbine wheel. The stator surrounds the rotor. The electric generator is configured to generate electrical power upon rotation of the rotor within the stator. The power electronics system is electrically connected to an electrical output of the electric generator. The power electronics system is configured to receive the electrical power from the electric generator and convert the electrical power to specified power characteristics. The heat exchanger is located downstream of the turbine wheel. The heat exchanger includes a first side and a second side. The first side is in fluid communication with the process gas. The second side is in fluid communication with a fluid stream from a second system unrelated to the electric generator. The fluid stream entering the second side of the heat exchanger has a second temperature that is greater than the first temperature of the process gas exiting the outlet of the turbine wheel. The heat exchanger is configured to cool the fluid stream using the process gas to produce a cooled stream.

This, and other aspects, can include one or more of the following features. The electric generator can include a three-phase permanent magnet synchronous generator. The second system can be unrelated to the process gas. The cooled stream can be a chilled water stream. The second system can be a district cooling system. The chilled water stream can be coupled to the district cooling system. The second system can include a data center rack. The fluid stream can be a heat transfer fluid that has received waste heat from the data center rack. The cooled stream can be coupled to the data center rack.

In a third aspect, a method includes flowing a process gas across a turbine wheel of an electric generator. The process gas expands and cools as the process gas flows across the turbine wheel. The process gas exits the electric generator at a first temperature. The method includes generating electrical power by the electric generator in response to the process gas flowing across the turbine wheel. The method includes directing the electrical power generated by the electric generator to a power electronics system. The method includes converting the electrical power by the power electronics system to specified power characteristics. The method includes flowing the process gas from the electric generator to a first side of a heat exchanger. The method includes flowing a fluid stream to a second side of the heat exchanger. The fluid stream is from a system that is unrelated to the electric generator. The fluid stream enters the second side of the heat exchanger at a second temperature that is greater than the first temperature. The method includes cooling the fluid stream by the heat exchanger using the process gas to produce a cooled stream.

This, and other aspects, can include one or more of the following features. The electric generator can include a three-phase permanent magnet synchronous generator. The system can be unrelated to the process gas. The process gas can include natural gas. The system can be a district cooling system. The cooled stream can be a chilled water stream. The method can include circulating the chilled water stream to the district cooling system. The system can include a data center rack. The fluid stream can be a heat transfer fluid that has received waste heat from the data center rack. The method can include circulating the cooled stream to the data center rack to capture additional waste heat. The process gas can include nitrogen gas. The first temperature can be less than −100 degrees Celsius (° C.).

The details of one or more implementations of the subject matter of this disclosure are set forth in the accompanying drawings and the description. Other features, aspects, and advantages of the subject matter will become apparent from the description, the drawings, and the claims.

DETAILED DESCRIPTION

Natural gas, hydrogen, and other process gases are pressurized to facilitate efficient transportation in pipelines that are sometimes many miles long. The pipelines, for example, transport gasses from production sites (e.g., wells) to processing facilities and from processing facilities to local distribution networks, such as regional, city or district networks or on site industrial plants networks. To deliver the gas safely through local distribution networks and for use, the process gas is depressurized to lower levels (often using pressure regulators). The pressure is stepped down at pressure letdown (PLD) stations for delivery to industrial, commercial, and residential end users. The PLD stations use regulating valves to achieve the required pressure drop, but also waste significant amounts of energy in the process. Additional regulating valves can be used at other locations for pressure control, such as in the pipelines between the production and processing facilities, within the sub-processes of the processing facilities, and within the end user's processes and piping. A turboexpander generator can be installed in parallel to the regulating valve to recover the wasted energy from pressure reduction and produce electrical power. The electrical power can be directed to a power grid or elsewhere. Along the same lines, a turboexpander generator can be installed at a gas storage facility upstream of one or more storage tanks to recover high pressure gasses dispensed from a tanker truck, through the turboexpander generator, to the storage tanks. The turboexpander generator is relevant in other applications, such as in a hydrogen liquefaction process where gaseous hydrogen that has been cooled and pressurized is expanded to a liquid state. The expansion can be performed through a turboexpander generator to recover the wasted energy from the expansion and produce electrical power. As above, the electrical power can be directed to a power grid or elsewhere, such as used to power compressors or other components of the liquefaction process. In each instance, by recovering lost energy from natural gas and hydrogen pressure letdown applications, the turboexpander can generate electricity while also reducing $CO_2$ emissions, increasing overall plant efficiency, offsetting electrical costs, and generating additional revenue.

Figure 1:
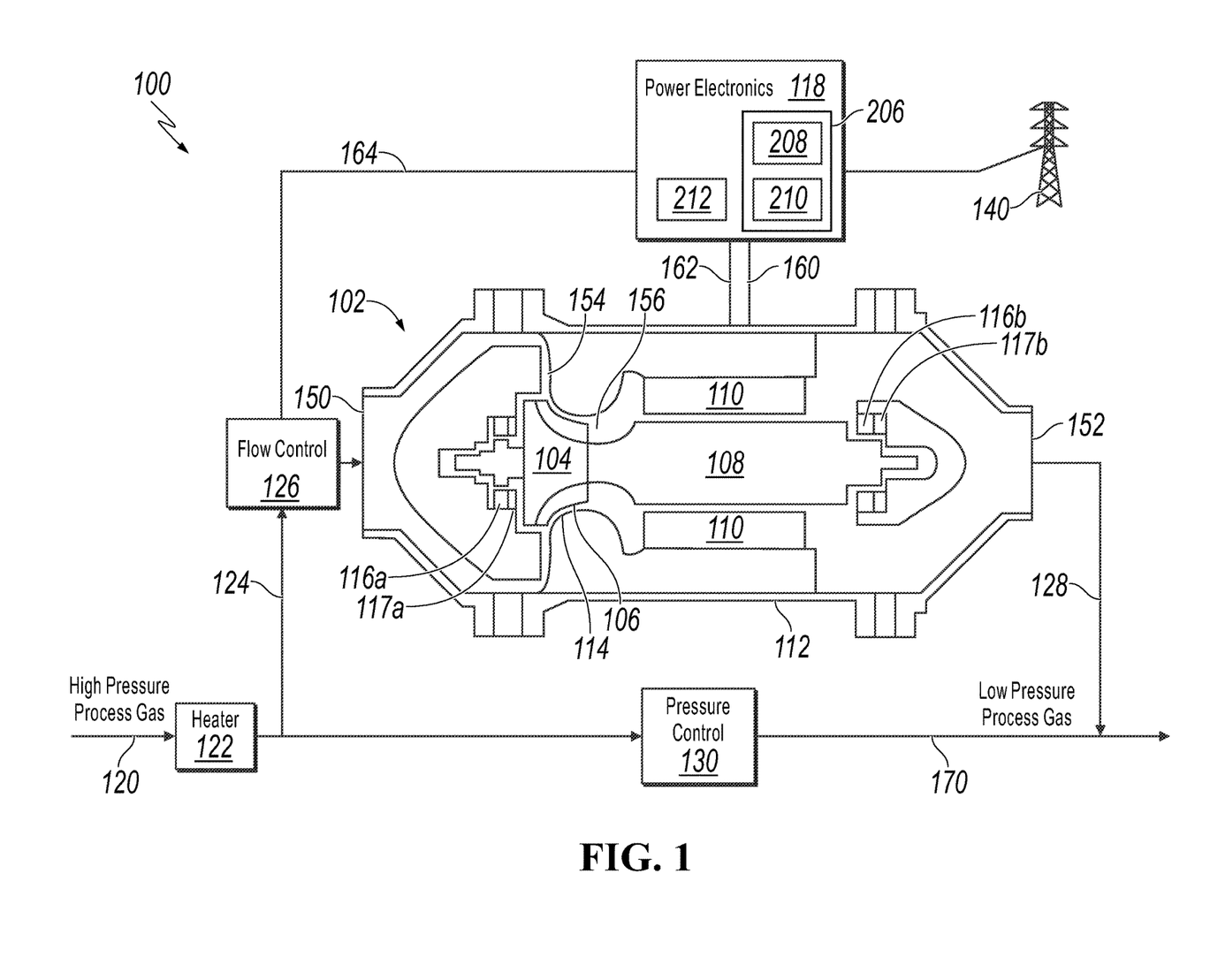
FIG. 1 is a schematic diagram of an example electrical power generation system coupled to a power grid.

FIG. 1 is a schematic diagram of an electrical power generation system 100 coupled to a power grid 140. The electrical power generation system 100 can be added at a PLD station to capture energy from gas expansion from the PLD process, or in any of the other applications described above. The electrical power generation system 100 includes a turboexpander 102 in parallel with a pressure control valve 130. The turboexpander 102 is arranged axially so that the turboexpander 102 can be mounted in-line with a pipe. The turboexpander 102 acts as an electric generator by generating electrical energy from rotational kinetic energy derived from expansion of a process gas 120 through a turbine wheel 104. For example, rotation of the turbine wheel 104 can be used to rotate a rotor 108 within a stator 110, which then generates electrical power.

The turboexpander 102 includes a high-performance, high-speed permanent magnet generator with an integrated radial in-flow expansion turbine wheel 104 and low loss active magnetic bearings (AMBs) 116a,b. The rotor assembly consists of the permanent magnet section with the turbine wheel 104 mounted directly to the rotor hub. The rotor 108 is levitated by the magnetic bearing system creating a frictionless (or near frictionless) interface between dynamic and static components. The AMBs 116a,b facilitate a lossless (or near lossless) rotation of the rotor 108.

The turboexpander 102 is designed to have a process gas 120 flow through the system 100, which cools the generator and eliminates the need for auxiliary cooling equipment. The turboexpander electronics 118 for the turboexpander 102 combines a power converter 206 and Magnetic Bearing Controller (MBC) 212 into one cabinet, in some implementations. The power converter 206 allows for a consistent and clean delivery of generated power from the turboexpander 102 to a power grid 140. The power converter 206 regulates the frequency and amplitude of the generated current to match the local grid. After expansion, the process gas 120 exits the turboexpander 102 along the same axial path for downstream processes.

The turboexpander 102 includes a flow-through configuration. The flow-through configuration permits the process gas 120 to flow from an inlet side of the turboexpander 102 to an outlet side of the turboexpander 102. The process gas 120 flows into a radial gas inlet 154 to the turbine wheel 104 and out of the turbine wheel 104 from an axial gas outlet 156. The process gas 120 then flow through the generator and out of the outlet 154, where the process gas 120 rejoins the gas pipeline 170. Generally, high pressure process gas 120 is directed to flow into the turboexpander 102 through a flow control system 126. The flow control system 126 includes a flow or mass control valve and an emergency shut off valve. Flow control system 126 can be controlled by turboexpander electronics 118 or other electrical, mechanical, or electromagnetic signal. For example, a fault condition can signal the flow control system 126 to close or partially close, thereby removing or restricting gas supply to the turboexpander 102. Restricting or removing gas flow to the turboexpander slows the rotation of the turbine wheel and consequently, slows the rotor. In the example shown in FIG. 1, a signal channel 164 from the turboexpander electronics 118 can be used to open and/or close the flow control system 126. In some implementations, the turboexpander housing 112 is hermetically sealed.

The process gas 120 is expanded by flowing across the turbine wheel 104, resulting in a pressure letdown of the process gas 120. The process gas 120 exits the turboexpander 102 at a decreased pressure. The expansion of the process gas 120 across the turbine wheel 104 causes the turbine wheel 104 to rotate, which causes the rotor 108 to rotate. The rotation of the rotor 108 within the stator 110 generates electrical power. The turboexpander 102 achieves the desired pressure letdown and captures the energy from the pressure letdown to generate electrical power. A pressure control valve 130, such as a conventional pressure regulator, can be installed in parallel to the turboexpander 102. The pressure control valve 130 can be used to control the pressure of the process gas 120 that flows through the turboexpander. Any excess high pressure process gas 120 that is not directed into the turboexpander 102 can be directed through the pressure control valve 130.

In some implementations, a heater 122 can heat the process gas 120 prior to flowing the process gas 120 into the turboexpander 102. For example, if the expansion of the process gas 120 through the turbine wheel 104 lowers the temperature of the process gas 120 to a point where moisture in the process gas 120 freezes at the turbine wheel 104 or another downstream location, the process gas 120 can be heated by heater 122 prior to entering the turboexpander 102. After heating, the process gas 120 can then be directed into the turboexpander 102. The heating of the process gas 120 can prevent freezing moisture as the process gas 120 expands and its temperature drops.

The turboexpander 102 includes a turbine wheel 104. The turbine wheel 104 is shown as a radial inflow turbine wheel, though other configurations are within the scope of this disclosure, such as axial flow turbine wheels. In this example, the process gas 120 is received from an inlet conduit 150 of the housing 112 enters a radially oriented inlet 154 of the turbine wheel 104. In some implementations, the process gas 120 flows through an inlet conduit 150 and is diverted by a flow diverter to a radial inlet 154 that directs the fluid into the radial inflow of the turbine wheel 104. After expanding, the process gas 120 exits the turbine wheel 104 from an axially oriented outlet 156 to outlet conduit 152 of the housing 112.

The turbine wheel 104 can be directly affixed to the rotor 108, or to an intermediate common shaft, for example, by fasteners, rigid drive shaft, welding, or other manner. For example, the turbine wheel 104 may be received at an end of the rotor 108, and held to the rotor 108 with a shaft. The shaft threads into the rotor 108 at one end, and at the other, captures the turbine wheel 104 between the end of rotor 108 and a nut threadingly received on the shaft. The turbine wheel 104 and rotor 108 can be coupled without a gearbox and rotate at the same speed. In other instances, the turbine wheel 104 can be indirectly coupled to the rotor 108, for example, by a gear train, clutch mechanism, or other manner.

The turbine wheel 104 includes a plurality of turbine wheel blades 106 extending outwardly from a hub and that interact with the expanding process gas 120 to cause the turbine wheel 104 to rotate. FIG. 1 shows an unshrouded turbine wheel 104, in which each of the turbine blades 106 has an exposed, generally radially oriented blade tip extending between the radial inlet 154 and axial outlet 156. As discussed in more detail below, the blade tips substantially seal against a shroud 114 on the interior of the housing 112. In certain instances, the turbine wheel 104 is a shrouded turbine wheel.

In configurations with an un-shrouded turbine wheel 104, the housing 112 includes an inwardly oriented shroud 114 that resides closely adjacent to, and at most times during operation, out of contact with the turbine wheel blades 106. The close proximity of the turbine wheel blades 106 and shroud 114 substantially seals against passage of process gas 120 therebetween, as the process gas 120 flows through the turbine wheel 104. Although some amount of the process gas 120 may leak or pass between the turbine wheel blades 106 and the shroud 114, the leakage is insubstantial in the operation of the turbine wheel 104. In certain instances, the leakage can be commensurate with other similar unshrouded-turbine/shroud-surface interfaces, using conventional tolerances between the turbine wheel blades 106 and the shroud 114. The amount of leakage that is considered acceptable leakage may be predetermined. The operational parameters of the turbine generator may be optimized to reduce the leakage. In some implementations, the housing 112 is hermetically sealed to prevent process gas 120 from escaping the radial inlet 154 of the turbine wheel 104.

The shroud 114 may reside at a specified distance away from the turbine wheel blades 106, and is maintained at a distance away from the turbine wheel blades 106 during operation of the turboexpander 102 by using magnetic positioning devices, including active magnetic bearings and position sensors.

Bearings 116a and 116b are arranged to rotatably support the rotor 108 and turbine wheel 104 relative to the stator 110 and the shroud 114. The turbine wheel 104 is supported in a cantilevered manner by the bearings 116a and 116b. In some implementations, the turbine wheel 104 may be supported in a non-cantilevered manner and bearings 116a and 116b may be located on the outlet side of turbine wheel 104. In certain instances, one or more of the bearings 116a or 116b can include ball bearings, needle bearings, magnetic bearings, foil bearings, journal bearings, or others.

Bearings 116a and 116b may be a combination radial and thrust bearing, supporting the rotor 108 in radial and axial directions. Other configurations could be utilized. The bearings 116a and 116b need not be the same types of bearings.

In implementations in which the bearings 116a and 116b are magnetic bearings, a magnetic bearing controller (MBC) 212 is used to control the magnetic bearings 116a and 116b. Position sensors 117a, 117b can be used to detect the position or changes in the position of the turbine wheel 104 and/or rotor 108 relative to the housing 112 or other reference point (such as a predetermined value). Position sensors 117a, 117b can detect axial and/or radial displacement. The magnetic bearing 116a and/or 116b can respond to the information from the positions sensors 117a, 117b and adjust for the detected displacement, if necessary. The MBC 212 may receive information from the position sensor(s) 117a, 117b and process that information to provide control signals to the magnetic bearings 116a, 116b. MBC 212 can communicate with the various components of the turboexpander 102 across a communications channel 162.

The use of magnetic bearings 116a, 116b and position sensors 117a, 117b to maintain and/or adjust the position of the turbine wheel blades 106 such that the turbine wheel blades 106 stay in close proximity to the shroud 114 permits the turboexpander 102 to operate without the need for seals (e.g., without the need for dynamic seals). The use of the active magnetic bearings 116a,b in the turboexpander 102 eliminates physical contact between rotating and stationary components, as well as eliminate lubrication, lubrication systems, and seals.

The turboexpander 102 may include one or more backup bearings. For example, at start-up and shut-down or in the event of a power outage that affects the operation of the magnetic bearings 116a and 116b, bearings may be used to rotatably support the turbine wheel 104 during that period of time. The backup bearings and may include ball bearings, needle bearings, journal bearings, or the like.

As mentioned previously, the turboexpander 102 is configured to generate electrical power in response to the rotation of the rotor 108. In certain instances, the rotor 108 can include one or more permanent magnets. The stator 110 includes a plurality of conductive coils. Electrical power is generated by the rotation of the magnet within the coils of the stator 110. The rotor 108 and stator 110 can be configured as a synchronous, permanent magnet, multiphase alternating current (AC) generator. The electrical output 160 can be a three-phase output, for example. In certain instances, stator 110 may include a plurality of coils (e.g., three or six coils for a three-phase AC output). When the rotor 108 is rotated, a voltage is induced in the stator 110. At any instant, the magnitude of the voltage induced in stator coils is proportional to the rate at which the magnetic field encircled by the coil is changing with time (i.e., the rate at which the magnetic field is passing the two sides of the coil). In instances where the rotor 108 is coupled to rotate at the same speed as the turbine wheel 104, the turboexpander 102 is configured to generate electrical power at that speed. Such a turboexpander 102 is what is referred to as a "high speed" turbine generator. For example, the turboexpander 102 can produce up to 280 kW at a continuous speed of 30,000 rpm. In some implementations, the turboexpander produces on the order of 350 kW at higher rotational speeds (e.g., on the order of 35,000 rpm).

In some implementations, the design of the turbine wheel 104, rotor 108, and/or stator 110 can be based on a desired parameter of the output gas from the turboexpander 102. For example, the design of the rotor and stator can be based on a desired temperature of the process gas 120 exiting the turboexpander 102.

The turboexpander 102 can be coupled to turboexpander electronics 118. Turboexpander electronics 118 can include power electronics, such as a power converter 206, and/or the magnetic bearing controller (MBC) 212 (discussed above). The power converter 206 can be, for example, a variable speed drive (VSD) or a variable frequency drive.

The electrical output 160 of the turboexpander 102 is connected to the power converter 206, which can be programmed to specific power requirements. In certain instances, the power converter 206 can include an insulated-gate bipolar transistor (IGBT) rectifier 208 to convert the variable frequency, high voltage output from the turboexpander 102 to a direct current (DC). In certain instances, the rectifier 208 can be a three-phase rectifier for three-phase AC input current. An inverter 210 then converts the DC from the rectifier 208 to AC for supplying to the power grid 140. In certain instances, the inverter 210 can convert the DC to 380 VAC-480 VAC at 50 to 60 Hz for delivery to the power grid 140. The specific output of the power converter 206 depends on the power grid 140 and application. Other conversion values are within the scope of this disclosure. The power converter 206 matches its output to the power grid 140 by sampling the grid voltage and frequency, and then changing the output voltage and frequency of the inverter 210 to match the sampled power grid voltage and frequency.

In some implementations, the power converter 206 is a bidirectional power converter. In such implementations, the rectifier 208 can receive an alternating current from the power grid 140 and convert the alternating current into a direct current. The inverter 210 can then convert DC from the rectifier 208 to AC for supplying to the generator. In such implementations, power can be delivered from the power grid 140 to the generator to drive rotation of the rotor 108, and in turn, the turbine wheel 104 to induce flow of a process gas. In sum, in implementations in which the power converter 206 is a bidirectional power converter, the flow of power can be reversed and used by the generator to induce flow of a process gas (as opposed to the process gas contributing expansion work to generate power). The power grid 140 that the turboexpander 102 can supply power to (and/or draw power from) can be a national or regional power grid, a local power grid for a city or district, or a small grid, local grid, or microgrid, such as an on-site grid that supplies power to a building, campus, industrial manufacturing or processing plant, or neighborhood.

The turboexpander 102 is also connected to the MBC 212 in the turboexpander electronics 118. The MBC 212 constantly monitors position, current, temperature, and other parameters to control the turboexpander 102 and the active magnetic bearings 116a and 116b. For example, the MBC 212 is coupled to position sensors 117a, 117b to monitor radial and axial position of the turbine wheel 104 and the rotor 108. The MBC 212 can control the magnetic bearings 116a, 116b to selectively change the stiffness and damping characteristics of the magnetic bearings 116a, 116b as a function of spin speed. The MBC 212 can also control synchronous cancellation, including automatic balancing control, adaptive vibration control, adaptive vibration rejection, and unbalance force rejection control.

Figure 2A:
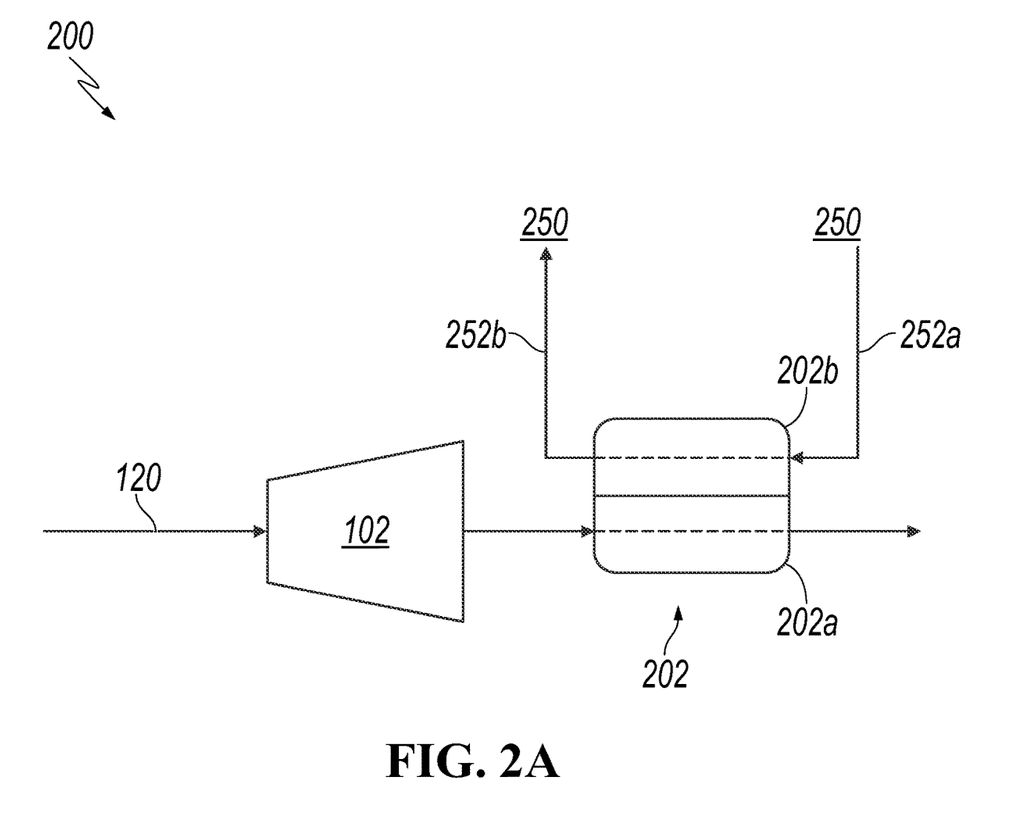
FIG. 2A is a schematic diagram of an example turboexpander system that implements process integration.

FIG. 2A is a schematic diagram of an example turboexpander system 200 that implements process integration. Turboexpander system 200 includes the turboexpander 102 and the turboexpander electronics 118 of system 100 (described previously and shown in FIG. 1). The turboexpander 102 receives a high pressure process gas 120. The process gas 120 is any pressurized gas that needs to be stepped down in pressure prior to use. For example, in certain instances, the process gas 120 is a gas that has been pressurized for transport, and once the process gas 120 has been transported to a specified location, the process gas 120 is stepped down in pressure by the turboexpander 102. The process gas 120 can be, for example, natural gas, hydrogen gas, or nitrogen gas. The process gas 120 expands as it flows through the turboexpander 102, which causes the turbine wheel 104 to rotate. The rotation of the turbine wheel 104 rotates the rotor 108 that supports a plurality of permanent magnets. The rotation of the permanent magnets on the rotor 108 induces a current through coils or windings on stator 110 to produce electrical power. The turboexpander electronics 118 allows for a consistent and clean delivery of generated power from the turboexpander 102.

The system 200 includes a heat exchanger 202 which integrates the system 200 with a separate system 250 by transferring heat between system 200 and system 250. Implementation of the heat exchanger 202 takes advantage of the cooling of the process gas 120 as it expands through the turboexpander 102. The heat exchanger 202 is located downstream of the turbine wheel 104. In the example shown in FIG. 2A, the heat exchanger 202 is located downstream of the turboexpander 102. In some implementations, the heat exchanger 202 is integrated with the turboexpander 102 while still being located downstream of the turbine wheel 104. In such implementations, the heat exchanger 202 and the turboexpander 102 can be installed at once as a singular unit. Such implementations may, in some cases, be easier to install in comparison to other implementations in which the heat exchanger 202 and the turboexpander 102 are separated and installed individually.

The heat exchanger 202 includes a first side 202a and a second side 202b. The heat exchanger 202 can be one or more heat exchangers configured to transfer heat between fluid flowing through the first side 202a and fluid flowing through the second side 202b. The first side 202a of the heat exchanger 202 is in fluid communication with the process gas 120. The process gas 120 flows from the turbine wheel 104 to the first side 202a of the heat exchanger 202. The second side 202b of the heat exchanger 202 is in fluid communication with a fluid stream 252a from the separate system 250. The fluid stream 252a flows from the system 250 to the second side 202b of the heat exchanger 202. In some implementations, the system 250 is unrelated to the turboexpander 102, for example, in that it does not utilize the power generated by the turboexpander 102. In some implementations, the system 250 is unrelated to the process gas 120, for example, in that it does not use the process gas 120 and is not involved in sourcing or processing the process gas 120.

The process gas 120 entering the first side 202a of the heat exchanger 202 has a first temperature. In some implementations, the first temperature is less than −100 degrees Celsius (° C.). The fluid stream 252a entering the second side 202b of the heat exchanger 202 has a second temperature that is greater than the first temperature of the process gas 120 entering the first side 202a of the heat exchanger 202. Thus, the process gas 120 is considered the "cold stream", and the fluid stream 252a is considered the "hot stream" in the heat exchanger 202. The heat exchanger 202 is configured to cool the fluid stream 252a using the process gas 120 to produce a cooled stream 252b. In implementations where the heat exchanger 202 is integrated with the turboexpander 102, the heat exchanger 202 can include ports on its second side 202b for allowing fluid communication to be established with the system 250. The heat exchanger 202 can have any flow configuration, such as co-current flow, countercurrent flow, crossflow, or hybrid flow. In co-current flow (also referred to as parallel flow), the two streams flowing through the heat exchanger flow parallel to and in the same direction as each other. In countercurrent flow (also referred to as antiparallel), the two streams flowing through the heat exchanger flow parallel to and in opposite directions of each other. In crossflow, the two streams flowing through the heat exchanger flow perpendicularly to one another. In hybrid flow, the two streams flow through the heat exchanger in a manner that combines any characteristic(s) of co-current flow, countercurrent flow, and crossflow. An implementation of the heat exchanger 202 is also shown in FIG. 2B and is described in more detail later.

The system 250 can be any system that requires cooling. The design of the turboexpander 102, flow control 126, pressure control 130, heat exchanger 202, or any combination of these can be adjusted based on a desired first temperature of the process gas 120 exiting the turboexpander 102 to be capable of providing adequate cooling to the system 250 or a component of the system 250 (such as the fluid stream 252a). The system 250 can be, for example, a district cooling system. The fluid stream 252a can be a water stream from the district cooling system that is cooled in the heat exchanger 202 by the process gas 120. The cooled stream 252b produced by the heat exchanger 202 can be a chilled water stream that is circulated back to the district cooling system to provide cooling. The system 250 can be, for example, a data center rack. The fluid stream 252a can be a heat transfer fluid that has received waste heat from the data center rack. The cooled stream 252b produced by the heat exchanger 202 can be circulated back to the data center rack to capture additional waste heat. In some cases, the system 250 is a waste heat capture system in which a heat transfer fluid receives waste heat, and the captured waste heat is utilized (for example, to generate power).

Figure 2B:
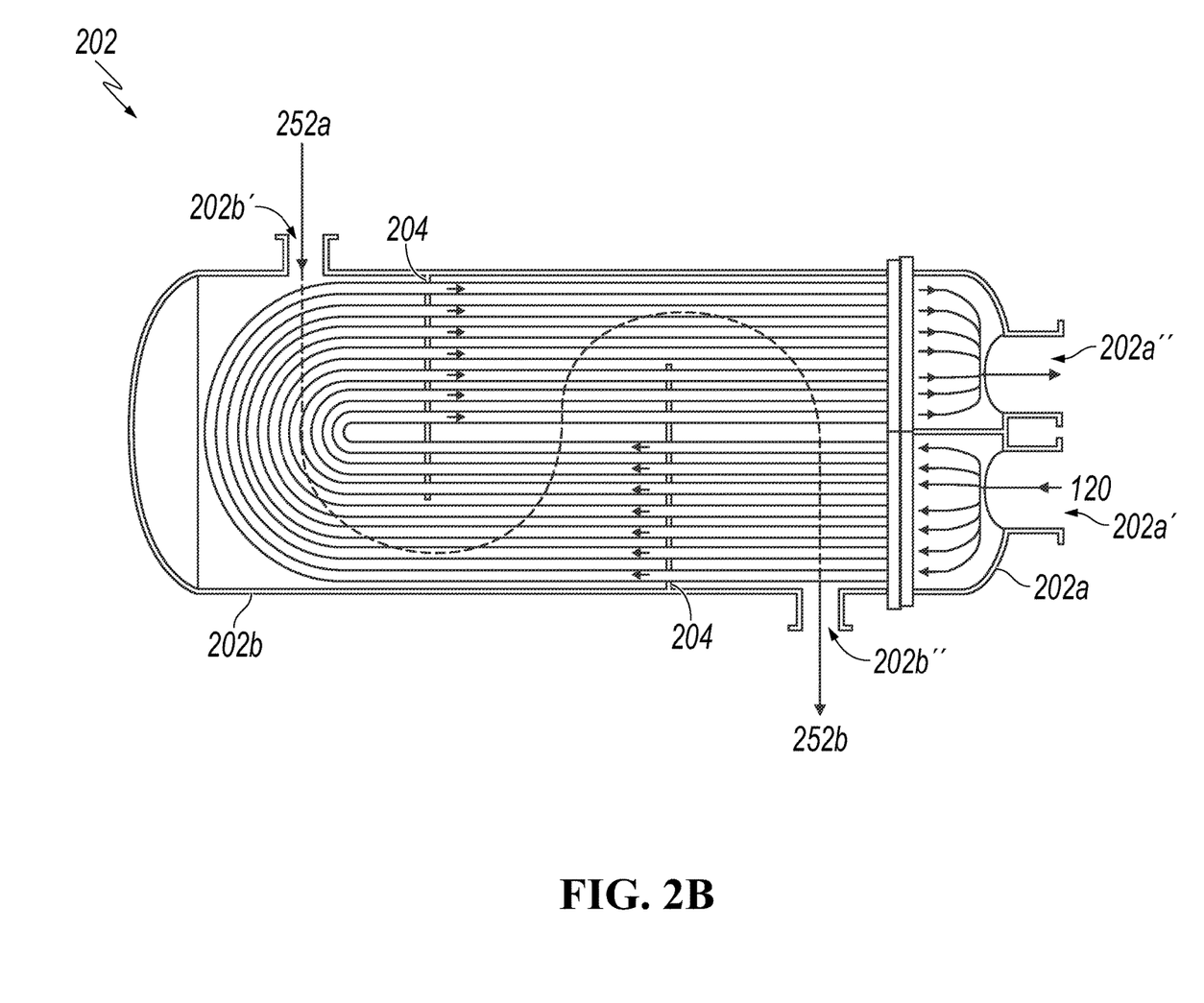
FIG. 2B is a schematic diagram of an example heat exchanger that can be implemented in the system of FIG. 2A.

FIG. 2B is a schematic diagram of an example heat exchanger 202 that can be implemented in the system 200. As mentioned previously, the heat exchanger 202 includes a first side 202a and a second side 202b. In some cases, as shown in FIG. 2B, the heat exchanger 202 is a shell-and-tube heat exchanger. In some implementations, the first side 202a for the process gas 120 (cold stream) is the tube-side of the shell-and-tube heat exchanger, and the second side 202b for the fluid stream 252a (hot stream) is the shell-side of the shell-and-tube heat exchanger. As shown in FIG. 2B, the tube-side (202a) can include an inlet port 202a' that receives the process gas 120 (cold stream). The flow of the process gas 120 splits and is distributed across the tubes. After the process gas 120 flows through the tubes, the process gas 120 rejoins and can exit side 202a via outlet port 202a". The example of the heat exchanger 202 shown in FIG. 2B has two passes. The number of passes is the number of times the tube-side passes through the fluid in the shell-side. The heat exchanger 202 has one or more passes. For example, the heat exchanger 202 can have one pass, two passes, three passes, four passes, or more than four passes.

As shown in FIG. 2B, the shell-side (202b) can include an inlet port 202b' that receives the fluid stream 252a (hot stream). In some implementations, the shell-side (202b) includes baffles 204 for directing the flow of the fluid stream 252a (hot stream) through the shell-side. The baffles 204 in FIG. 2B allow for a hybrid flow configuration (crossflow, countercurrent flow, and co-current flow). The fluid stream 252a can exit side 202b via outlet port 202b".

The heat exchanger 202 can have any appropriate stationary head type, such as removable channel and cover, bonnet (integral cover), integral with tubesheet cover, channel integral with tubesheet and removable cover, or special high-pressure closures. The heat exchanger 202 can have any appropriate shell type, such as one-pass shell, two-pass shell with longitudinal baffle, split flow, double split flow, divided flow, or cross flow. The heat exchanger 202 can have any appropriate rear head type, such as fixed tube sheet with stationary head, outside packed floating head, floating head with buckling device, pull-through floating head, U-tube bundle, or externally sealed floating tubesheet.

In some implementations, the first side 202a is the shell-side, and the second side 202b is the tube-side. Although shown in FIG. 2B as a U-tube type shell-and-tube heat exchanger, the heat exchanger 202 implemented in system 200 can optionally be a different type of shell-and-tube heat exchanger, for example, straight-tube or floating head. Although shown in FIG. 2B as a shell-and-tube heat exchanger, the heat exchanger 202 implemented in system 200 can optionally be a different type of heat exchanger, for example, a double pipe heat exchanger or a plate-type heat exchanger (such as plate-fin, plate-and-frame, plate- and shell, and spiral-plate).

Figure 3:
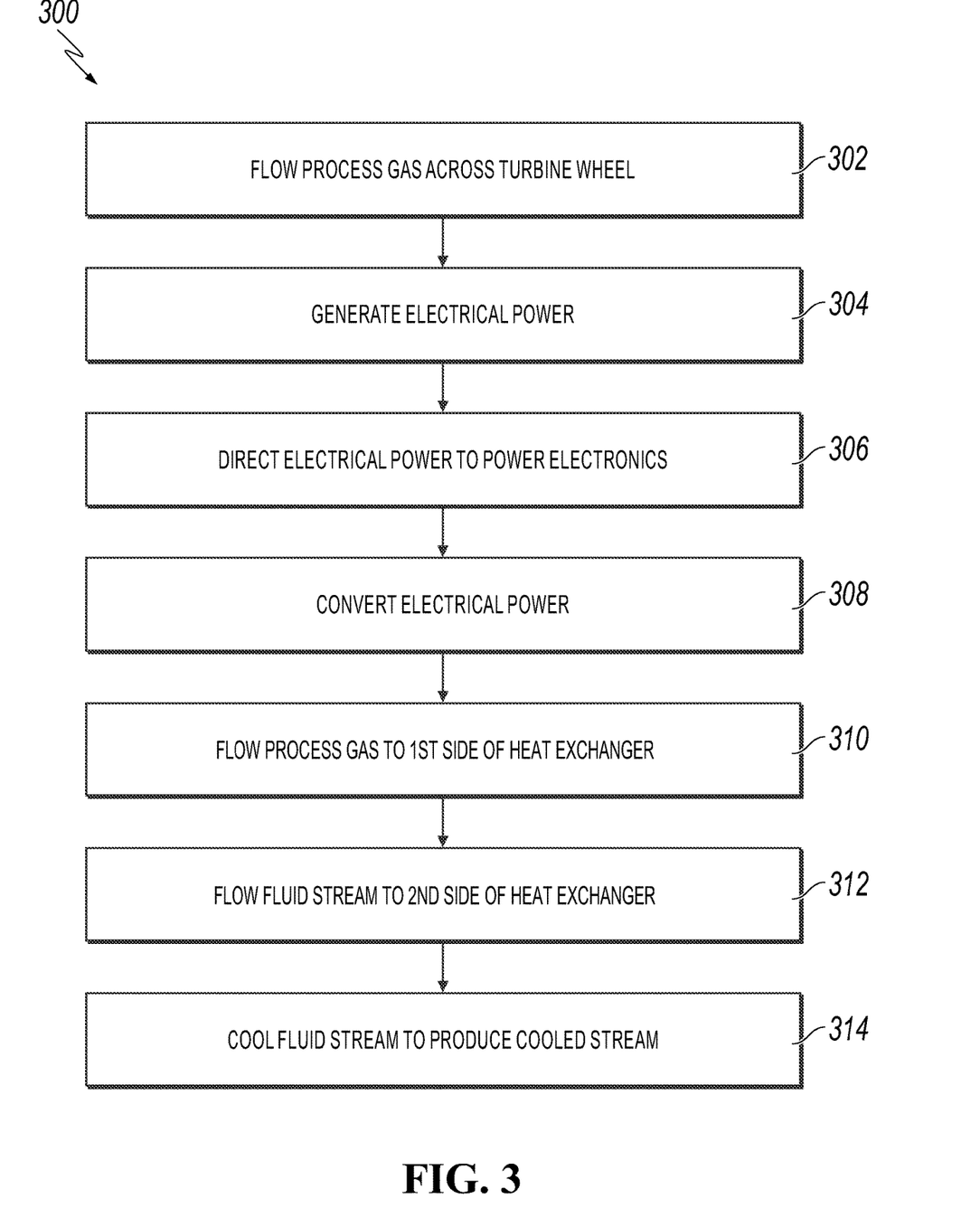
FIG. 3 is a flow chart of an example method for process integration in electrical power generation.

FIG. 3 is a flow chart of an example method 300 for process integration in electrical power generation. The method 300 can be implemented, for example, by an implementation of the turboexpander system 200. At block 302, a process gas (such as the process gas 120) is flowed across a turbine wheel (such as the turbine wheel 104) of an electric generator (such as the turboexpander 102). The process gas 120 expands and cools as it flows across the turbine wheel 104 at block 302. The process gas 120 exits the turboexpander 102 at a first temperature. At block 304, electrical power is generated by the turboexpander 102 in response to the process gas 120 flowing across the turbine wheel 104. At block 306, the electrical power (generated by the turboexpander 102 at block 304) is directed to a power electronics system (such as the turboexpander electronics 118). At block 308, the electrical power is converted by the turboexpander electronics 118 to specified power characteristics (for example, to be compatible with the power grid 140). At block 310, the process gas 120 is flowed from the turboexpander 102 to a first side of a heat exchanger (such as the first side 202a of the heat exchanger 202). At block 312, a fluid stream (such as the fluid stream 252a) is flowed to a second side (such as the second side 202b) of the heat exchanger 202. As described previously, the fluid stream 252a is from a system (250) that is unrelated to the turboexpander 102. In some implementations, the system 250 is also unrelated to the process gas 120. The fluid stream 252a enters the second side 202b of the heat exchanger 202 at block 312 at a second temperature that is greater than the first temperature. At block 314, the fluid stream 252a is cooled by the heat exchanger 202 using the process gas 120 to produce a cooled stream (such as the cooled stream 252b). At block 314, heat is transferred from the fluid stream 252a flowing through the second side 202b of the heat exchanger 202 to the process gas 120 flowing through the first side 202a of the heat exchanger 202.

The specification and drawings are, accordingly, to be regarded in an illustrative sense rather than a restrictive sense. Furthermore, the foregoing use of implementation and other exemplarily language does not necessarily refer to the same implementation or the same example, but may refer to different and distinct implementations, as well as potentially the same implementation. In the foregoing specification, a detailed description has been given with reference to specific exemplary implementations. It will, however, be evident that various modifications and changes may be made thereto without departing from the broader spirit and scope of the disclosure as set forth in the claims.

What is claimed is:

1. A system comprising:
    a pipe located at a pressure letdown (PLD) station and connected to a pipeline flowing a process gas comprising pipeline natural gas, pipeline hydrogen, or pipeline nitrogen;
    an electric generator arranged axially and in-line with the pipe, the electric generator comprising:
        a turbine wheel configured to receive the process gas and rotate in response to expansion of the process gas flowing into an inlet of the turbine wheel and out of an outlet of the turbine wheel, wherein the process gas cools as the process gas flows across the turbine wheel and expands, and the process gas exiting the outlet of the turbine wheel has a first temperature;
        a rotor coupled to the turbine wheel and configured to rotate with the turbine wheel; and
        a stator, wherein the electric generator is configured to generate electrical power upon rotation of the rotor within the stator;
    a power electronics system electrically connected to an electrical output of the electric generator and configured to receive the electrical power from the electric generator and convert the electrical power to specified power characteristics; and
    a heat exchanger located downstream of the turbine wheel, the heat exchanger comprising a first side in fluid communication with the process gas and a second side in fluid communication with a fluid stream from a second system apart from the electric generator and the power electronics system, the second system comprising a data center, the fluid stream entering the second side of the heat exchanger having a second temperature greater than the first temperature of the process gas, the heat exchanger configured to cool the fluid stream using the process gas to produce a cooled stream.

2. The system of claim 1, wherein the first temperature is less than −100 degrees Celsius (° C.).

3. The system of claim 1, wherein the second system comprises a district cooling system connected to the data center, the cooled stream is a chilled water stream, and the chilled water stream is coupled to the district cooling system.

4. The system of claim 1, wherein the data center comprises a data center rack, the fluid stream is a heat transfer fluid that has received waste heat from the data center rack, and the cooled stream is coupled to the data center rack.

5. The system of claim 1, wherein the fluid stream comprises a heat transfer fluid that has received waste heat from the data center.

6. The system of claim 5, wherein the data center comprises a data center rack, and the heat transfer fluid receives waste heat from the data center rack.

7. The system of claim 1, wherein the electric generator comprises a hermetically sealed housing from an inlet of the electric generator to an outlet of the electric generator, the hermetically sealed housing enclosing the turbine wheel, the rotor, and the stator.

8. The system of claim 7, wherein the housing is hermetically sealed in-line in the pipe so that the process gas flows through the turbine wheel and over the stator.

9. The system of claim 1, wherein the electric generator comprises a turboexpander, and the rotor comprises a permanent magnet section including one or more permanent magnets positioned radially adjacent to the stator.

10. The system of claim 1, wherein the heat exchanger is integrated into the electric generator.

11. A system comprising:
    an electric generator arranged axially and in-line with a pipe flowing a process gas comprising natural gas, hydrogen, or nitrogen, the electric generator comprising:
        a turbine wheel configured to receive the process gas and rotate in response to expansion of the process gas flowing into an inlet of the turbine wheel and out of an outlet of the turbine wheel, wherein the process gas cools as the process gas flows across the turbine wheel and expands, and the process gas exiting the outlet of the turbine wheel has a first temperature;
        a rotor coupled to the turbine wheel and configured to rotate with the turbine wheel; and
        a stator, wherein the electric generator is configured to generate electrical power upon rotation of the rotor within the stator;
    a power electronics system electrically connected to an electrical output of the electric generator and configured to receive the electrical power from the electric generator and convert the electrical power to specified power characteristics; and
    a heat exchanger located downstream of the turbine wheel, the heat exchanger comprising a first side in fluid communication with the process gas and a second side in fluid communication with a fluid stream from a second system apart from the electric generator and the power electronics system, the second system comprising a data center, the fluid stream entering the second side of the heat exchanger having a second temperature greater than the first temperature of the process gas, the heat exchanger configured to cool the fluid stream using the process gas to produce a cooled stream.

12. The system of claim 11, wherein the first temperature is less than −100 degrees Celsius.

13. The system of claim 11, wherein the fluid stream comprises a heat transfer fluid that has received waste heat from the data center.

14. The system of claim 13, wherein the data center comprises a data center rack, and the heat transfer fluid receives waste heat from the data center rack.

15. The system of claim 14, wherein the cooled stream is coupled to the data center rack.

16. The system of claim 11, wherein the electric generator comprises a hermetically sealed housing from an inlet of the electric generator to an outlet of the electric generator, the hermetically sealed housing enclosing the turbine wheel, the rotor, and the stator.

17. The system of claim 16, wherein the housing is hermetically sealed in-line in the pipe so that the process gas flows through the turbine wheel and over the stator.

18. The system of claim 11, wherein the electric generator comprises a turboexpander, and the rotor comprises a permanent magnet section including one or more permanent magnets positioned radially adjacent to the stator.

19. The system of claim 11, wherein the heat exchanger is integrated into the electric generator.

* * * * *